United States Patent [19]

Nakanishi et al.

[11] Patent Number: 5,465,047

[45] Date of Patent: Nov. 7, 1995

[54] ELECTRON SPIN RESONATOR HAVING VARIABLE RESONANCE FREQUENCY AND ERROR DETECTING AUTOMATIC FREQUENCY CONTROL

[75] Inventors: Akio Nakanishi; Akira Furuse, both of Osaka; Kazuo Nakagawa, Tokyo; Makoto Tsuneda, Tokyo; Atsushi Nukanobu, Tokyo, all of Japan

[73] Assignees: Nikkiso Co., Ltd., Tokyo; Sumitomo Special Metals Co., Ltd., Osaka, both of Japan

[21] Appl. No.: 98,324

[22] PCT Filed: Dec. 4, 1992

[86] PCT No.: PCT/JP92/01587

§ 371 Date: Oct. 14, 1993

§ 102(e) Date: Oct. 14, 1993

[87] PCT Pub. No.: WO93/11425

PCT Pub. Date: Oct. 6, 1993

[30] Foreign Application Priority Data

Dec. 6, 1991 [JP] Japan ................................ 3-322957

[51] Int. Cl.⁶ .................................................. G01R 33/20
[52] U.S. Cl. ............................................ 324/316; 333/219
[58] Field of Search ............................... 324/316, 317, 324/318, 300; 333/231–233, 17.1; 128/653.2

[56] References Cited

U.S. PATENT DOCUMENTS

| | | | |
|---|---|---|---|
| 2,471,419 | 5/1949 | Edson et al. | 333/233 |
| 3,350,633 | 10/1967 | Hyde | 324/316 |
| 3,714,550 | 1/1973 | Hyde | 324/316 |
| 3,771,054 | 11/1973 | Hyde | 324/316 |
| 3,879,653 | 4/1975 | Hyde et al. | 324/316 |
| 4,243,961 | 1/1981 | Faillon | 333/233 |
| 4,360,776 | 11/1982 | Bauman | 324/316 |
| 4,593,248 | 6/1986 | Hyde et al. | 324/317 |
| 4,623,835 | 11/1986 | Mehdizadeh et al. | 324/316 |

(List continued on next page.)

FOREIGN PATENT DOCUMENTS

| | | |
|---|---|---|
| 461790 | 12/1949 | Canada. |
| 53-70287 | 6/1978 | Japan. |
| 57-18139 | 4/1982 | Japan. |
| 61-140847 | 6/1986 | Japan. |
| 63-75853 | 5/1988 | Japan. |

OTHER PUBLICATIONS

J. Hyde et al., "EPR automatic frequency control circuit with field effect transistor (FET) microwave amplification", American Institute of Physics, Aug. 1988, vol. 58, No. 8, pp. 1352–1356.

J. Brivati et al., "A Radiofrequency ESR Spectrometer for in Vivo Imaging", Journal of Magnetic Resonance, May 1991, vol. 92, No. 3, pp. 480–489.

P. Lesniewski et al., "Phase noise reduction of a 19 GHz veractor-tuned Gunn oscillator for electron paramagnetic resonance spectroscopy", Review of Scientific Instruments, Aug. 1990, vol. 61, No. 8, pp. 2248–2250.

By P. Ludowise et al., "A Convenient Monitor of EPR Automatic Frequency Control Function", Journal of Magnetic Resonance, Jun. 1991, vol. 93, No. 2, pp. 410–412.

*Primary Examiner*—Sandra L. O'Shea
*Assistant Examiner*—Raymond Y. Mah
*Attorney, Agent, or Firm*—Young & Thompson

[57] ABSTRACT

In a fixed polarized magnetic field generated by permanent magnets 10, a cylindrical cavity resonator 12 and a coil 14 modulating the magnetic field are provided. A micro-wave f generated from a micro-wave oscillator 16 is supplied through an isolator 18 and a subsequent attenuator 20 and then a circulator 24 to the cavity resonator. The oscillation output of a modulating frequency oscillator 42 is supplied to the coil 14. A movable end plate 60 is moved by a driving feature 58 to vary the resonance frequency $f_0$ for a detection thereof and a subsequent negative feed back to a micro-wave oscillator 16 through a circuit comprising a low frequency amplifier 48, a phase detector 50, a low frequency oscillator 54, a phase shifter 56 and a micro-wave oscillator power source 52 thereby the micro-wave frequency f is so swept as to be maintained to be equal to the resonance frequency $f_0$.

2 Claims, 4 Drawing Sheets

U.S. PATENT DOCUMENTS

| | | | |
|---|---|---|---|
| 4,726,071 | 2/1988 | Jachowski | 333/231 |
| 4,847,561 | 7/1989 | Soohoo | 324/316 |
| 4,888,554 | 12/1989 | Hyde et al. | 324/316 |
| 5,243,310 | 9/1993 | Calco | 333/233 |

5,465,047

ELECTRON SPIN RESONATOR HAVING VARIABLE RESONANCE FREQUENCY AND ERROR DETECTING AUTOMATIC FREQUENCY CONTROL

BACKGROUND OF THE INVENTION

1. Field of the Invention

This invention relates to an electron spin resonator, and more particularly to an electron spin resonator provided with means for detecting resonance signals by sweeping a frequency.

2. Description of the Related Art

Conventionally, most electron spin resonators employ a system for sweeping a magnetic field for a signal detection. In the electron spin resonator of the magnetic field sweeping system, a sample placed in a static magnetic field is applied with a micro-wave magnetic field and further the static magnetic field is so swept as to capture an absorption of an energy of the micro-wave into the sample with an electron spin resonance. Normally, the sweep of the static magnetic field is accomplished by sweeping an excitation current of a permanent magnet which generates a static magnetic field. A large power source for the excitation and a cooling to compensate for a heat generation from a sweep coil are necessary. There is an electron spin resonator employing a system for sweeping a frequency by use of permanent magnets without any large excitation power source. A range of the sweep is limited into an extremely narrow band.

In the above mentioned electron spin resonator, the magnetic field sweeping system becomes the main current rather than the frequency sweeping system because the frequency sweeping system primary has the following two problems. The first problem is a difficulty in a wide range sweep of the micro-wave frequency. The second problem is that a quality factor Q of micro-wave cavity resonators is very high thereby it is possible to response a frequency in a very narrow range only.

The former problem will be described in detail. For tuning a frequency of a micro-wave oscillator, a mechanical tuning and an electrical tuning are generally used together with one another. In a measurement of the electron spin resonance, the electrical tuning of the oscillator is employed to accomplish a smooth and continuous sweep. It seems that a sweep range of approximately 10% is necessary for the measurement of the electron spin resonance ordinary used. In klystrons widely and conventionally used, a variable range of a frequency against an output frequency for the mechanical tuning is 5% to 10%, but that for the electrical tuning is only 0.2% to 0.5%. Even when a varactor is used together with a gunn diode recently and widely used, it is approximately 0.5%. The electric tuning was therefore unable to accomplish a wide range sweep of the frequency of the micro-wave.

With respect to the latter, a quality factor Q of the cavity resonator for detecting the electron spin resonance signals is high, or 4,000 to 10,000. The resonant frequency is determined almost by a mechanical size of the resonator. Then, it is impossible to accomplish a wide range sweep of the frequency.

However, if the problems are solved, a change from the magnetic field sweep system into the frequency sweep system is able to make it unnecessary to use the large power source for the excitation and a cooling water and the like. Such change is further able to make the electron spin resonator free from an institutional facility accommodating a power source and a water supply equipment so that the electron spin resonator becomes portable for a considerable reduction of conditions of the measurement and the facility thereof.

SUMMARY OF THE INVENTION

It is an object of the present invention to provide an electron spin resonator employing a system of sweeping a frequency which is able to conduct such a wide range sweep as being actually sufficient to detect a resonance signal.

An electron spin resonator according to the present invention is characterized in that a cavity resonator for detecting electron spin resonance signals of a measured sample is arranged in a fixed polarized magnetic field to cause a variation of a resonance frequency of the cavity resonator and there is provided an automatic frequency control means which detects an error signal given by a difference between the resonance frequency and an applied micro-wave frequency generated by the resonance signal variation and then amplifies the detected signal and further conducting a negative feedback of the amplified signal into a micro-wave oscillator thereby the frequency of the micro-wave is controlled to have the micro-wave frequency so follow the resonance frequency as to have the error signal become zero.

Alternatively, it is available that the cavity resonator for detecting the electron spin resonance signal of the measured sample is arranged in the fixed polarized magnetic field to sweep the frequency of the micro-wave to be applied to the cavity resonator for a detection of an error signal given by a difference between an applied micro-wave frequency and a resonance frequency of the cavity resonator generated by the sweep of the applied micro-wave frequency and thereafter the detected signal is amplified and then subjected to a negative feedback into a control means for controlling the resonance frequency of the cavity resonator thereby the resonance frequency of the cavity resonator is controlled to make the micro-wave frequency so follow the resonance frequency as to have the error signal become zero.

According to the electron spin resonator of the present invention, frequency-variable micro-wave oscillators which accept a wide range variation of the frequency, for example, a YTO (YIG-Tuned Oscillator) employing a YIG (Yttrium-Iron-Garnett) filter as a feedback circuit and frequency synthesizers are usable to control the frequency of the oscillator so as to have it follow the variable resonance frequency of the cavity resonator. To prevent use of an internal modulation coil which makes the variation of the resonance frequency difficult, a resonance frequency variable cavity resonator having a wide range is usable to control the micro-wave frequency so as to have it follow the variable resonance frequency of the cavity resonator thereby the electron spin resonance within a necessary range is measurable with fixing the polarized magnetic field.

DESCRIPTION OF THE PREFERRED EMBODIMENTS

Embodiments of an electron spin resonator according to the present invention will hereinafter be described in detail with reference to the accompanying drawings.

Figure 1:
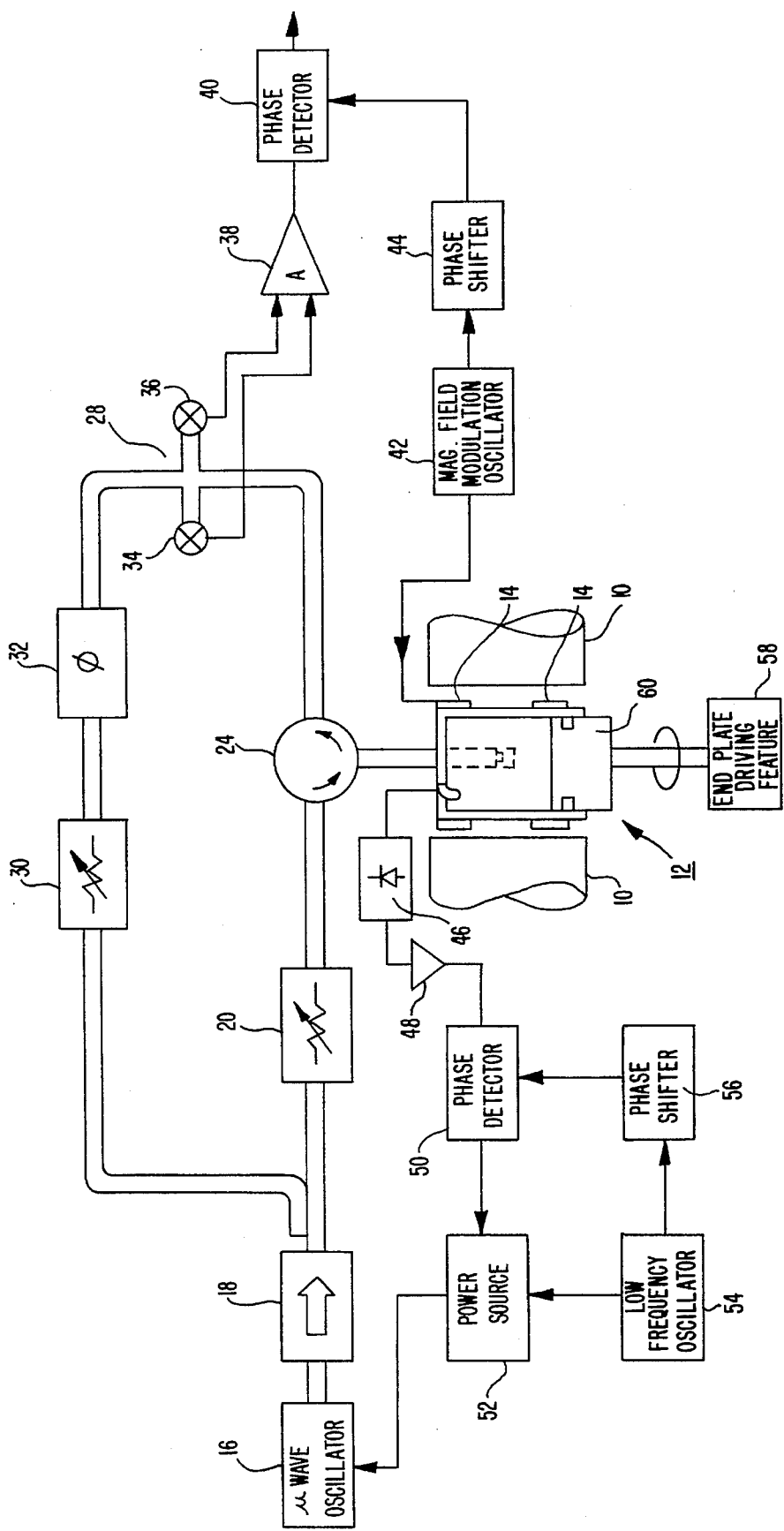
FIG. 1 is a circuit diagram illustrative of one embodiment of an electron spin resonator according to the present invention.
Figure 2:
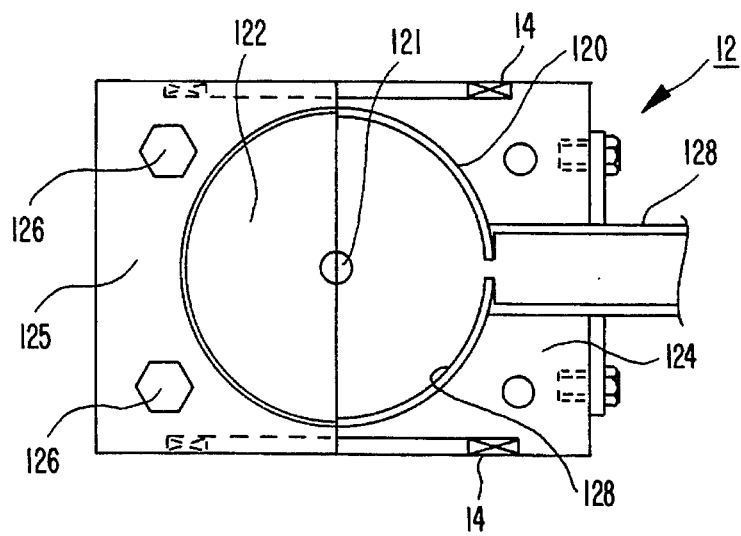
FIG. 2 is a plane view illustrative of a detailed structure of a cylindrical cavity resonator of a $TE_{011}$ mode used in an electron spin resonator in FIG. 1.
Figure 3:
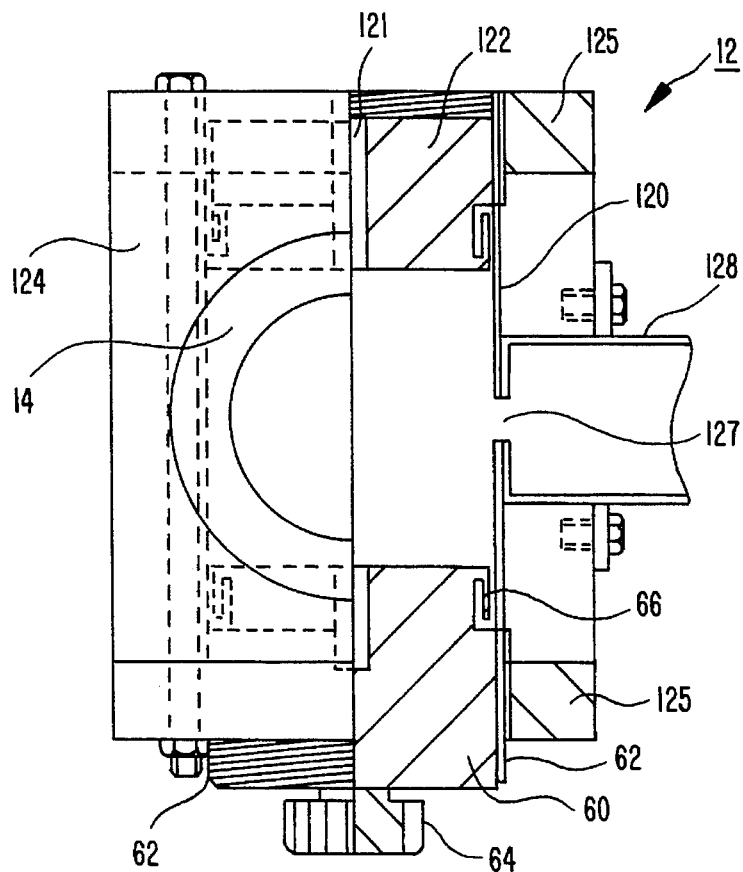
FIG. 3 is a side view illustrative of a detailed structure of a cylindrical cavity resonator of a $TE_{011}$ mode used in an electron spin resonator in FIG. 1.

FIG. 1 is a circuit diagram illustrative of one embodiment of an electron spin resonator according to the present invention. FIGS. 2 and 3 are constructive views illustrative in detail of a cylindrical cavity resonator of $TE_{011}$ mode used in the electron spin resonator in FIG. 1. In FIG. 1, a cavity resonator 12 accommodating a measured sample and magnetic field modulating coils 14 are arranged in a fixed polarized magnetic field formed by permanent magnets 10. Micro-wave power is generated by a micro-wave oscillator 16 and then transmitted through an isolator 18, an attenuator 20 and a circulator 24 into the cavity resonator 12, the sample exhibits a spin resonance to absorb a part of the supplied micro-wave power thereby a variation of a resonant impedance of the cavity resonator appears. Then, a reflection coefficient of the cavity resonator is varied to cause a variation of the micro-wave which will be transmitted through the circulator 24 into a hybrid-T 28. This is a signal to be detected as the electron spin resonance of the sample. On the other hand, in a static magnetic field, magnetic field modulation coils 14 are applied with a current of a frequency $f_m$ supplied from a modulation oscillator 46 thereby the polarized magnetic field is applied with a magnetic field modulation of a frequency $f_m$. Then, the resonance signal includes a modulation component of the frequency $f_m$.

A reference micro-wave signal is divided from the micro-wave oscillator 16 and then transmitted through an attenuator 30 and a phase shifter 32 into the hybrid-T 28. The micro-wave signal is mixed with the reference micro-wave signal to be detected by micro-wave detectors 34 and 36. This is called homodyne detection. Outputs of the micro-wave detectors 34 and 36 obtain the signal component of the frequency $f_m$. The resonance signal from the sample and the reference micro-wave signal are supplied to a H-face and an E-face of the hybrid-T respectively. After the homodyne detection, the modulated signal components are obtained at the outputs of the micro-wave detectors 34 and 36 as signals having the same amplitudes as each other and having opposite phases relative to each other. A signal amplifier for receiving these signals employs a differential amplifier system so that the two modulated signal components are added to each other and then amplified for a subsequent transmission into a phase detector 40. The reference micro-waves are supplied at imphase to the micro-wave detectors 34 and 36 respectively. After the homodyne detection, the reference micro-waves also appear as detected outputs of imphase and then are erased by the differential amplifier without passing through the amplifier 38. This removes a variation of the amplitude of the oscillator 16 or a common mode noise independent from the resonance signal to improve the sensitivity of the electron spin resonator.

A part of the output from the magnetic field modulation oscillator 42 is supplied as the reference signal of the phase detection through the phase shifter 44 into the phase detector 40. Then, the output of the phase detector 40 is a direct current component proportional to the modulated signal component and to a cosine of the difference in phase between the modulated signal component and the referece signal for a subsequent transmission into an external output apparatus such as a recorder or an A/D converter. The purpose of the phase shifter 44 is to adjust the phases so that the direct current component becomes maximum namely the difference in phase between the modulated signal component and the reference signal component becomes zero.

A power source 52 for the micro-wave oscillator, a micro-wave detector 46, a low frequency narrow band amplifier 48, a low frequency oscillator 54 and an inphase shifter 56 constitute an automatic frequency control system (hereinafter referred to as an AFC) to support the micro-wave frequency $f_m$ equal to a resonance signal frequency $f_0$. An action of the AFC is associated with the cavity resonator 12 and will be described in detail after descriptions of the cavity resonator.

A $TE_{011}$-mode cylindrical cavity resonator 12 used for the electron spin resonator according to the present invention is so constructed as illustrated in FIGS. 2 and 3. FIGS. 2 and 3 are plane and side views and the right half thereof are section views. The cavity resonator 12 is provided at an upper portion on an axial center of a cylinder 120 with a half fixing end plate 122 having a sample tube insertion hole 121 and at a lower portion thereof with a movable end plate 60 respectively. The cylinder 120 and the above two plates are formed on those inner faces with conductive thin films 123. A pair of magnetic modulation coils 14 and 14 are arranged at a perpendicular to the axial direction of the cylinder 120. This example is an X-band $TE_{011}$-mode cylindrical cavity resonator penetrated with the cylinder 120 having a diameter of approximately 42 mm. A body 124 of the cavity is supported by cavity supporters 125 and 125 at opposite ends thereof with cavity assembling screws 126 and 126. The cylinder 120 is coupled to a wave guide 128 through a coupling hole 127. The movable end plate 60 at the bottom end of the cylinder 120 is notched by screws for a slight movement and further provided with an end plate driving gear wheel 64. A diameter of the movable end plate 60 at its part serving as an inner face of the cavity is slightly smaller than that of an internal diameter, of the cavity cylinder 120 so that it has a $\lambda/4$ choke structure 66 as illustrated in FIG. 3. Then, the movable end plate 60 is coupled through a micro-wave but not mechanically with the cylindrical inner wall. This is able to vary the resonance frequency with keeping the quality factor Q of the cavity resonator high. It has been well known that it is possible to prevent a $TM_{111}$-mode from appearing, which tends to be degenerated in a $TE_{001}$-mode. The cavity body 120 is made of a quartz glass having a low coefficient of expansion. Alternatively, a ceramics having a low coefficient of expansion and a high polymer are available. The cavity resonator 12 at its cubic block has a cavity adjusting both the frequency mode and the use mode of the micro-wave.

The resonance frequency $f_0$ of the cylindrical $TE_{011}$-mode cavity resonator 12 is given as well known by the following equation $$(f_0 \cdot D)^2 = C_2(3.8317/\pi)^2 + (C/2)^2 (D/L)^2$$

where C is a light speed and D and L are a diameter and an axial length of the cavity resonator 12 respectively. When the diameter D is fixed and the axial length L is varied, the variation of the resonance frequency is so varied as being almost inversely proportional to the axial length L.

An end plate driving feature 58 of the movable end plate 60 may be constructed so that the λ/4 choke structure 66 at its behind in the movable end plate 60 is notched with the screws as illustrated in FIGS. 2 and 3 to rotate the movable plate 60 through the end plate driving gear wheel 64 and pulse motors not illustrated for a smooth movement of the movable plate 60 along the inner wall of the cavity. Alternatively, it is available to provide an air bearing feature well known in an aperture between the movable plate 60 and the inner wall of the cavity resonator for a smooth movement of the movable plate 60. Of course, it is available to use such end plate moving features as to be able to match the object of the present invention.

So far as the electron spin resonator having such circuit configuration provided with the cavity resonator 12 and the end plate driving feature 58 as illustrated in FIG. 1 is concerned, the following is drawn to the automatic frequency control feature (AFC) making the micro-wave frequency f follow and correspond to the resonance frequency $f_0$ variable by sweep.

The micro-wave oscillator 16 is supplied with an active voltage and a frequency control signal from the micro-wave oscillator power supply 52. The frequency control signal is superimposed onto the micro-wave oscillator signal by a small sine wave of a frequency $f_a$ from a low frequency oscillator 54 so that the micro-wave oscillator 16 outputs a micro-wave frequency-modulated by the low frequency and then fetched through a loop provided in the low frequency oscillator 54. The micro-wave to be inputted into the wave detector 46 is subjected to an amplitude modulation of a frequency $f_a$ according to the property of the cavity resonator as illustrated in FIG. 5(A) where f is a microwave frequency, $f_0$ is a resonance frequency of the cavity resonator and $f_a$ is a low frequency given by a modulation for the micro-wave.

Figure 5A:
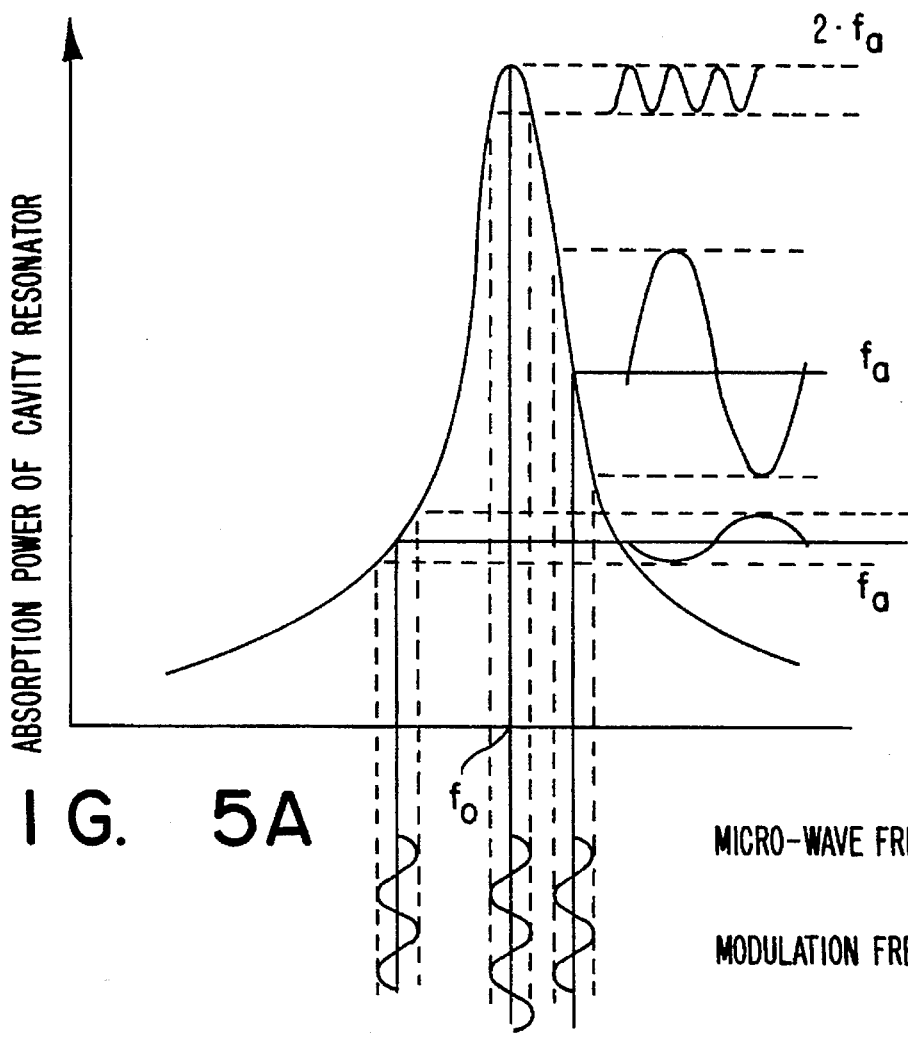
FIG. 5 is an explanatory view with respect of a method of an automatic frequency control used in an electron spin resonator according to the present invention.
Figure 5B:
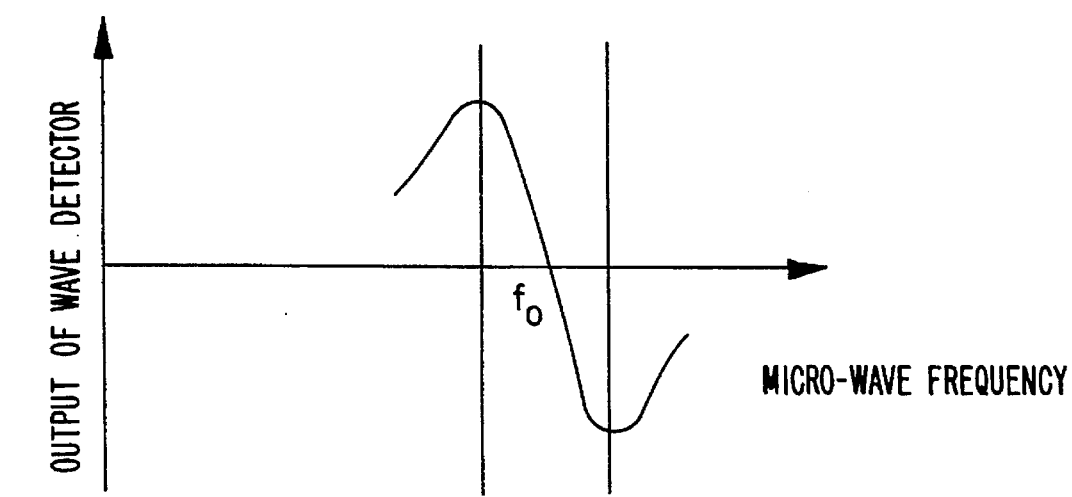

If $f=f_0$, the micro-wave is subjected to an amplitude modulation of a frequency $2f_a$ as illustrated in FIG. 5(A). Then, the micro-wave detector 46 detects the micro-wave and then obtains the signal of the frequency $2f_a$ as the low frequency output and no composition of the frequency $f_a$. When the micro-wave frequency f is not equal to the resonance frequency $f_0$, according to $f<f_0$ or $f>f_0$, an output of the frequency $f_a$ is obtained at inphase or inverse phase to the reference signal to the phase detector 50. The obtained output has an amplitude almost proportional to a difference between f and $f_0$ in the vicinity of the resonance frequency $f_0$. This frequency component is amplified by the narrow band amplifier of a center frequency $f_a$ and then transmitted into the phase detector 50. The phase detector 50 is applied with the reference signal of the frequency $f_a$ from the oscillator 54. Then, the phase detector 50 shows a zero output when $f=f_0$. When the micro-wave frequency f is not equal to the resonance frequency $f_0$, according to $f<f_0$ or $f>f_0$, such a positive or negative direct current output as illustrated in FIG. 5(B) is obtained. This output is subjected to a negative feed back into the micro-wave oscillator power source 52 as an error signal which indicates a degree of detuning of the micro-wave f to the resonance frequency $f_0$. This allows the micro-wave frequency f to be so controlled as to be equal to the resonance signal $f_0$ through the control signal to the micro-wave oscillator 16. The phase shifter 56 is to adjust the phases so that a difference in phase becomes zero between the output of the wave detector 46 and the reference signal to the phase detector 50. The above description is drawn to the operation of the AFC circuit well known by a person having skill in the art. The present invention employs a method like the micro-wave frequency automatic control. The conventional AFC conducts a constant value control for setting a target value of the control at the fixed resonance frequency of the cavity resonator. In contrast, the present invention conducts a follow-control which sets a target value at the variable resonance frequency and then makes the micro-wave oscillation frequency follow the target. Erasing the control offset seeks the follow control system in which control elements include two dimensional integral elements although illustrations do not show the above clearly.

Figure 4:
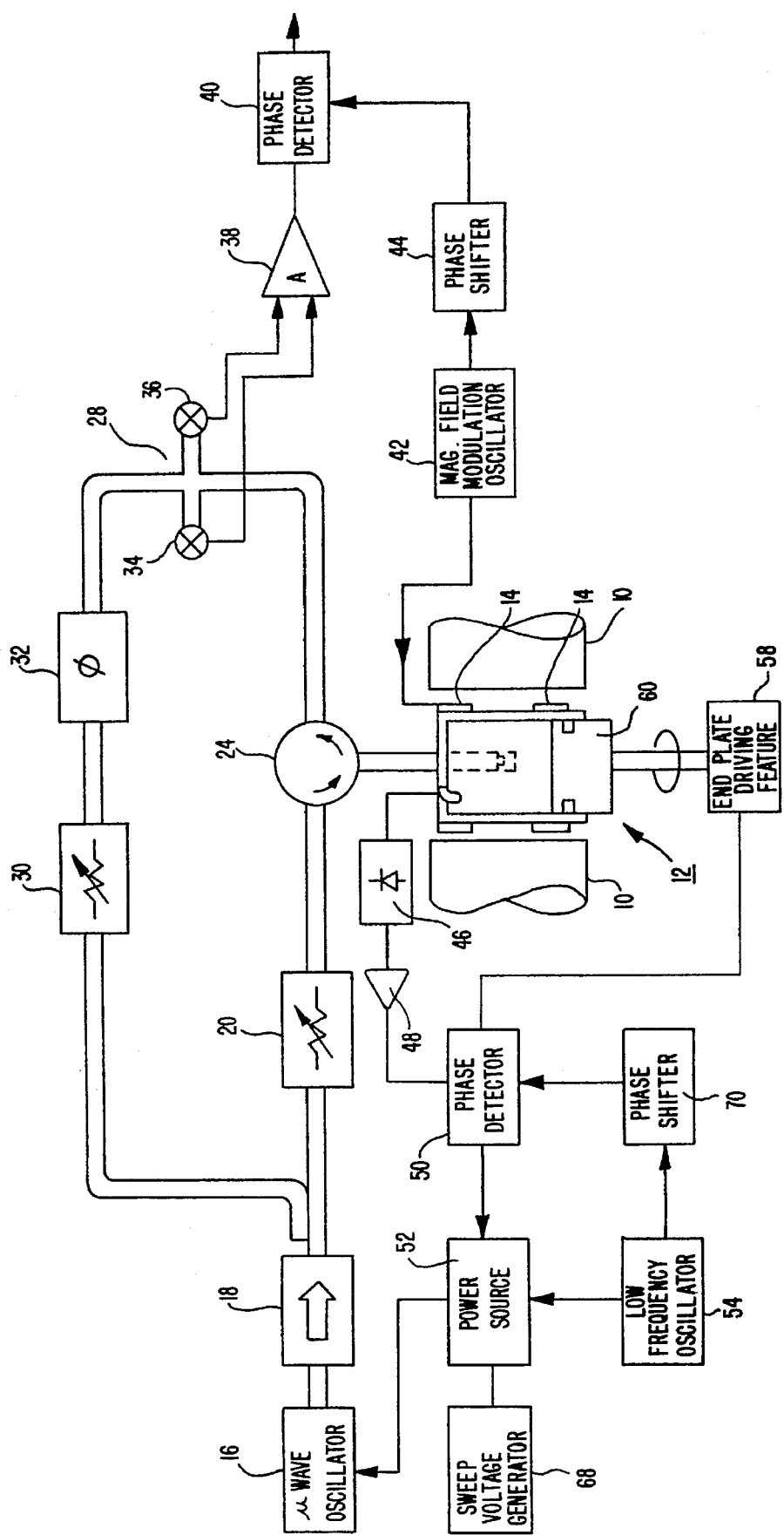
FIG. 4 is a circuit diagram illustrative of another embodiment of an electron spin resonator according to the present invention.

FIG. 4 illustrates another embodiment of the circuit configuration of the electron spin resonance circuit. For convenience, the same structural elements as those in FIG. 1 are labeled with the same numbers as those in FIG. 1 and descriptions thereof are omitted. The difference thereof in FIG. 4 are in that an output of a sweep voltage generator 68 is supplied to the micro-wave oscillator power source 52 and one of outputs of the low frequency oscillator 54 for the AFC is supplied though a phase shifter 70 into the phase detector 50 as well as an output of the phase detector 50 is supplied to the end plate driving feature 58.

In this embodiment, the micro-wave frequency f is swept by the sweep voltage generator 68. An error signal $f-f_0$ between the resonance frequency $f_0$ and the micro-wave frequency f given by a detection with the wave-detector 46 is amplified by the low frequency amplifier 48 and then fed back negatively to the end plate driving feature 58 through the phase detector 50. The end plate driving feature 58 makes the resonance frequency $f_0$ of the cavity resonator 12 so varied as to follow the target.

From the above described embodiments it is apparent that according to the present invention the variable frequency micro-wave oscillator is so employed that the oscillation frequency is controlled to follow the resonance frequency of the variable resonance frequency cavity resonator. This allows a wide range sweep of the micro-wave frequency and a measurement of the electron spin resonance in a wide frequency range covering a necessary range with fixing the polarized magnetic field.

This allows the permanent magnets to be used as the polarized magnetic field effectively to provide considerable effects in a large reduction of a necessary power and in freeing from a water supply equipment.

Further, spectrums are measured as an amount corresponding to a frequency or an energy for a subsequent direct analysis and its facility.

Although the above preferred embodiments of the present invention was drawn to the cylindrical $TE_{011}$-mode cavity resonator as an example, a method like the above is generally applicable to cylindrical $TE_{01n}$-mode cavity resonator (where n is an integer). Accordingly, it is not intended to be considered in limiting the present invention into the above embodiments. It would no doubt be intended that a spirit and scope of the present invention covers all modifications of the present invention.

What is claimed is:

1. An electron spin resonator comprising: a cavity resonator arranged within a fixed polarized magnetic field to detect an electron spin resonant signal of a measuring sample; an automatic frequency control means whereby a resonant frequency of the cavity resonator is varied to detect, as an error signal, a difference between said resonant frequency of said cavity resonator and a frequency of a micro-wave applied to said cavity resonator, said micro-wave being generated by said variation of the resonant frequency; means for amplifying said detected error signal; and means for negatively feeding back said amplified error signal to a micro-wave oscillator so that a micro-wave signal output therefrom is controlled to follow the resonant frequency so as to reduce said error signal to zero.

2. An electron spin resonator comprising: a cavity resonator arranged within a fixed polarized magnetic field to detect an electron spin resonant signal of a measuring sample; an automatic frequency control means whereby a frequency of a micro-wave applied to the cavity resonator is swept to detect, as an error signal, a difference between a resonant frequency of the cavity resonator generated by the sweep of the frequency of the applied micro-wave and the frequency of the applied micro-wave; means for amplifying the detected error signal; and means for negatively feeding back said error signal to a cavity resonator so that the resonant frequency of the cavity resonator is controlled to follow the frequency of a micro-wave signal output from said micro-wave oscillator so as to reduce said error signal to zero.

* * * * *